United States Patent [19]
Ackley

[11] Patent Number: 4,594,719
[45] Date of Patent: Jun. 10, 1986

[54] PHASE-LOCKED LASER ARRAY HAVING A NON-UNIFORM SPACING BETWEEN LASING REGIONS

[75] Inventor: Donald E. Ackley, West Amwell Township, Hunterdon County, N.J.

[73] Assignee: RCA Corporation, Princeton, N.J.

[21] Appl. No.: 572,113

[22] Filed: Jan. 19, 1984

[51] Int. Cl.$^4$ .............................................. H01S 3/19
[52] U.S. Cl. ........................................ 372/50; 372/45; 372/46; 372/48
[58] Field of Search ........................ 372/50, 45, 46, 48

[56] References Cited

U.S. PATENT DOCUMENTS

| | | | |
|---|---|---|---|
| 3,701,047 | 10/1972 | Caplan et al. | 331/94.5 |
| 3,753,801 | 8/1973 | Lockwood | 148/171 |
| 4,092,659 | 5/1978 | Ettenberg | 357/18 |
| 4,178,564 | 12/1979 | Ladany et al. | 331/94.5 |
| 4,255,717 | 3/1981 | Scifres et al. | 331/94.5 |
| 4,347,486 | 8/1982 | Botez | 372/46 |
| 4,369,513 | 1/1983 | Umeda et al. | 372/46 |
| 4,385,389 | 5/1983 | Botez | 372/50 |

OTHER PUBLICATIONS

D. E. Ackley, Applied Physics Letters, 42, 152 (1983).
D. R. Scifres et al., Electronics Letters, 19, 169 (1983).
D. Scifres et al., Applied Physics Letters, 41, 614 (1982).
D. R. Scifres et al., Electronics Letters, 18, 549 (1982).

Primary Examiner—James W. Davie
Attorney, Agent, or Firm—Birgit E. Morris; Donald S. Cohen; William J. Burke

[57] ABSTRACT

A phase-locked semiconductor array wherein the lasing regions of the array are spaced an effective distance apart such that the modes of oscillation of the different lasing regions are phase-locked to one another. The center-to-center spacing between the lasing regions is non-uniform. This variation in spacing perturbs the preferred 180° phase difference between adjacent lasing regions thereby providing an increased yield of arrays exhibiting a single-lobed, far-field radiation pattern.

11 Claims, 3 Drawing Figures

PHASE-LOCKED LASER ARRAY HAVING A NON-UNIFORM SPACING BETWEEN LASING REGIONS

The invention described herein was made in the performance of work under NASA Contract No. NAS 1-17441 and is subject to the provisions of Section 305 of the National Aeronautics and Space Act of 1958 (72 Stat. 435; 42 U.S.C. 2457).

The invention relates to a monolithic, phase-locked semiconductor laser array having a variable spacing between the laser regions thereby providing an output laser beam which comprises substantially a single lobe.

BACKGROUND OF THE INVENTION

A semiconductor injection laser typically comprises a body of semiconductor material having a thin active layer between cladding regions of opposite conductivity type. To increase the output power, a guide layer having a refractive index which is intermediate between that of the active and cladding layers may be interposed between one of the cladding regions and the active region. Light generated in the active layer propagates in both the active and guide layers thereby forming a larger beam at the emitting facet of the body. The cavity region, comprising an active layer or the combination of a guide layer and an active layer, restricts oscillation in the transverse direction, the direction perpendicular to the plane of the layers, to the fundamental optical mode. In the lateral direction, the direction in the plane of the layers and perpendicular to the axis of light propagation, it has been found useful to introduce structural variations which produce an optical waveguide which in turn restricts the oscillation to the fundamental optical mode. Lasers incorporating transverse and lateral waveguides, such as that disclosed by Botez in U.S. Pat. No. 4,347,486, incorporated herein by reference, may have output powers in excess of about 40 milliwatts in the fundamental lateral and transverse mode.

To increase the output power in the laser beam beyond the capability of such an individual laser, monolithic arrays of spaced-apart laser devices, such as that disclosed by Botez et al. in U.S. Pat. No. 4,547,396 and incorporated herein by reference, have been fabricated wherein the modes of oscillation of the individual lasers are coupled to one another to form a single phase-locked coupled oscillator. Such arrays that operate in a single longitudinal mode to output powers as high as 80 milliwatts have been observed. However, a problem with the typical phase-locked array is that nearly all of the devices have operated in such a manner that the far-field radiation pattern in the lateral direction has consisted of two lobes symmetrically located about the normal to the emitting surface of the array. This far-field distribution results because of gain considerations that cause adjacent devices to operate such that their relative phase is 180°. This far-field pattern is undesirable from a systems viewpoint because it requires excessively large optics to collimate the emitted beam. It would be desirable to have a phase-locked semiconductor laser array operating in the single transverse and lateral mode and having a far-field radiation pattern comprising a single lobe oriented perpendicular to the emitting surface of the laser.

SUMMARY OF THE INVENTION

A phase-locked laser array comprises a body of semiconductor material having opposed reflecting end faces, at least one of which is partially transmitting so that laser light may be emitted therefrom, and electrical contacts to the body. The array also includes means for defining a plurality of substantially parallel lasing regions in the body and extending between the end faces. The lasing regions defined by these means are spaced an effective distance from adjacent lasing regions so that the radiation modes of the adjacent lasing regions are phase-locked to one another with the center-to-center spacing between adjacent lasing regions being non-uniform across the array.

DETAILED DESCRIPTION OF PREFERRED EMBODIMENTS

Figure 1:
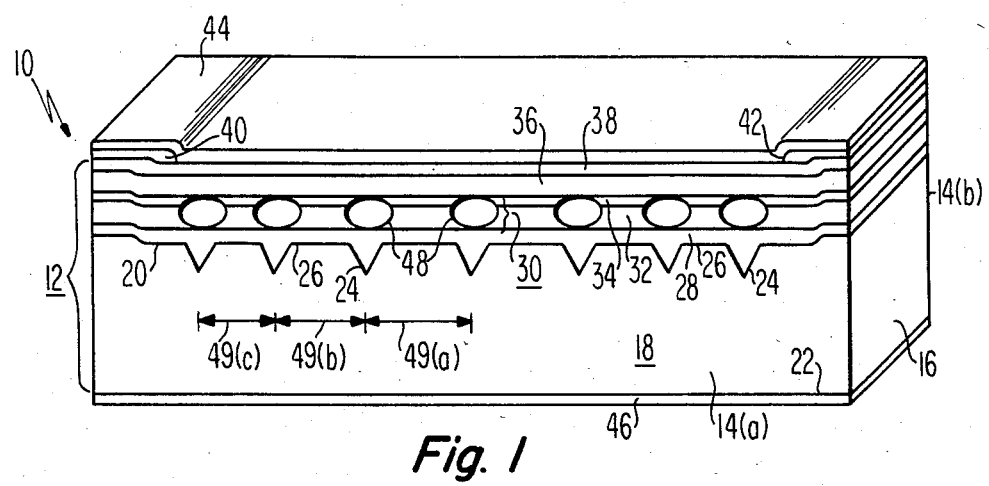
FIG. 1 is a perspective view of a laser array of the invention.
Figure 2:
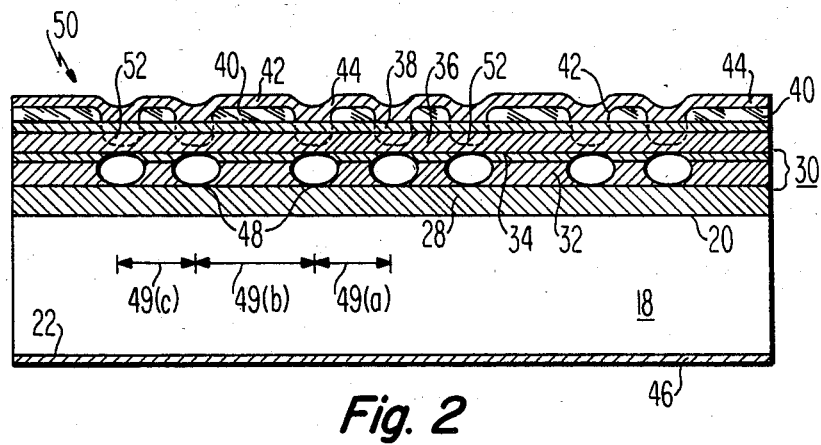
FIG. 2 is a cross-sectional view of a second embodiment of the laser array of the invention.

In FIGS. 1 and 2 the corresponding elements of the different embodiments of the laser array of the invention have the same numerical identification.

In FIG. 1 a laser array 10 incorporating the invention comprises a body 12 of single-crystalline semiconductor material having spaced, parallel reflecting end faces 14(a) and 14(b) with the reflecting face 14(a) being partially transparent so that laser light may be emitted therefrom. The body 12 also includes spaced, substantially parallel side surfaces 16 which extend between and are perpendicular to the end faces 14(a) and 14(b).

The semiconductor body 12 includes a substrate 18 having first and second major surfaces, 20 and 22 respectively, which extend between and are perpendicular to both the end faces 14(a), and 14(b) and the side surfaces 16. The first major surface 20 includes a plurality of spaced, substantially parallel channels 24 with lands 26 therebetween. A first cladding layer 28 overlies the surfaces of the substrate 20 and the lands 26 and fills the channels 24. A cavity region 30 overlies the first cladding layer 28 and comprises a guide layer 32 overlying the first cladding layer 28 and an active layer 34 overlying the guide layer 32. A second cladding layer 36 overlies the cavity region 30 and a capping layer 38 overlies a second cladding layer 36. An electrically insulating layer 40, having an opening 42 extending therethrough over the channels 26, overlies the capping layer 38. An electrical contact 44 overlies the capping layer 38 in the region of the opening 42. A second electrical contact 46 overlies the second major surface 22.

The lasing regions 48 denoted by the ovals in the cavity region 30, extend between the end faces 14(a) and 14(b) and are centered over the channels 24. The center-to-center spacings between the lasing regions 48 are variable across the array 10 in a lateral direction. The center-to-center spacings 49(a), 49(b) and 49(c) to one side of the axial center line of the array are shown as decreasing with increasing distance from the center line.

The lasing regions 48 of the array 10 of FIG. 1 are defined by lateral variations of the local effective transverse refractive index arising from the presence of the channels. The optical waveguides so formed are called "index guides". In FIG. 2 the lasing regions 48 of the array 50 are defined by higher conductivity regions 52 which extend a distance into the capping and second cladding layers, 38 and 36 respectively, toward the cavity region 30. The regions 52 laterally confine the electrical current thereby limiting the lasing action to specific portions of the cavity region 30. The optical waveguides so formed are called "gain guides". The center-to-center spacings 49(a), 49(b) and 49(c) of the array 50 are shown to be random.

The alloys used for the particular layers of the array should be such that the refractive index of the active layer 34 is greater than the refractive index of the guide layer 32 which in turn is greater than the refractive index of cladding layers 28 and 56. The laser array of the invention may be formed of materials such as GaAs and AlGaAs which have the requisite refractive index differences. Alternatively, alloys of other Group III or V elements such as In, Ga, P, Sb and As may be used.

A substrate 18 and the first cladding layer 28 are of one conductivity type and the second cladding layer 36 and the capping layer 38 are of the opposite conductivity type. In the cavity region 30 the positions of the guide layer 32 and the active layer 34 are interchangeable. The guide layer 32 is preferably positioned between the first cladding layer 28 and the active layer 34 as shown in the FIGURES and, in this case, has the same conductivity type as the first cladding layer 28. In some applications the guide layer 32 may be positioned between the active layer 34 and the second cladding layer 36 in which case the guide layer 32 has the same conductivity type as the second cladding layer 36. In other applications the guide layer 32 may not be present.

While the principles of the invention have been described in relation to laser arrays 10 and 50 of FIGS. 1 and 2, respectively, it is to be understood that these principles are equally applicable to any laser array having a plurality of laser regions extending between the end faces and redefined by one or more structural features of the array. Preferably these structural features have uniform width in the lateral direction thereby providing lasing regions having uniform width in the lateral direction and are such that all the lasing regions will oscillate at nearly the same fundamental lateral and transverse mode. This uniformity will produce modes of oscillation in the different lasing regions having the same propagation constant which will, in turn, provide stronger phase-locking between the different lasing regions. Structural features having non-uniform widths will provide lasing regions having different modes of oscillation and thus different propagation constants, thereby providing weaker inter-region coupling or no coupling at all.

The lasing regions 48 are spaced an effective distance apart such that the laser oscillations in the different lasing regions are phase-locked to one another with the center-to-center spacing between adjacent lasing regions being variable or non-uniform in the lateral direction. For a particular array, including the type and shape of the optical guides and the shape and curvature of the layers through which the coupling occurs, there will be a maximum spacing between adjacent lasing regions over which the coupling strength will be sufficient to phase-lock the lasing regions to one another. The center-to-center spacing between any pair of adjacent lasing regions must then be less than this maximum distance. The lateral variation in the center-to-center spacing may be random, monotonically increasing or decreasing with distance from the lateral center of symmetry of the array, or it may follow some other functional relationship.

The uniform spacing of the lasing regions in prior art lasers arrays provides a structure in which a 180° phase difference between adjacent lasing regions is favored. The array preferably operates so as to ensure the maximum overlap of the optical field with the lateral spatial gain distributions. For this to occur, the nulls in the lateral electric field distribution must occur in the unpumped or absorbing regions between the lasing regions, leading to the 180° phase shift between adjacent lasing regions. The introduction of a variable, non-uniform or non-constant spacing between the lasing regions will cause a non-uniform or laterally varying location of the nulls in the lateral electric field distribution. This non-uniformity will lead to a variation in the coupling strength between the lasing regions and may also lead to an alteration of the relative phase between the lasing regions 48 as the separation between the lasing regions changes.

The means for defining the lasing regions 48 include any structures which provide laterally spaced optical index or gain guides. Botez et al. in U.S. Pat. No. 4,547,396 has disclosed a laser array wherein the lasing regions are defined by channels in the substrate which form the index guides in the lateral direction. The index guides define the lasing regions as portions of the cavity region centered over the channels. Ackley, in Applied Physics Letters 42, 152 (1983), has disclosed an array wherein the elements are defined by channels in the second cladding layer combined with a zinc diffusion into the surface of the channelled layer. The combination of the channels and the diffusion confines the lasing region to the portions of the cavity region between the channels. Scifres in Electronics Letters 19, 169 (1983) has disclosed a laser array wherein the lasing region is defined by higher conductivity regions extending a distance into the capping layer and second cladding layer from stripes in an overlying, electrically insulating layer.

The laser array of the invention may be fabricated using well-known liquid-phase epitaxy techniques such as those disclosed by Lockwood et al. in U.S. Pat. No. 3,753,801, by Botez in U.S. Pat. No. 4,347,486, both of which are incorporated herein by reference, and by Botez et al. in U.S. Pat. No. 4,547,396 referred to above. Alternately vapor-phase and molecular-beam epitaxy techniques well known in the art may be used.

The substrate 18 is preferably composed of N-type GaAs having a first major surface 18 which is parallel or slightly misoriented from a [100] crystallographic plane. The channels 24, if present, may be formed using standard photolithographic and etching techniques as disclosed by Botez in U.S. Pat. No. 4,347,486 or, preferably, by the technique disclosed by Botez et al. in U.S. Pat. No. 4,547,396. The maximum center-to-center spacing between the channels 24 is preferably about 10 micrometers ($\mu$m) with a minimum depth of about 1 $\mu$m and a typical channel width at the surface 20 between about 2 and 3 $\mu$m. It is to be understood that the substrate 18 is also meant to include an epitaxial layer on the surface 20 of the substrate in which the channels 24 are formed. The first cladding layer 28 is typically between about 0.2 and 0.5 $\mu$m thick, preferably about 0.4

μm thick, over the lands 26 and is typically composed of N-type $Al_rGa_{1-r}As$ where r is between about 0.2 and 0.45 and preferably between about 0.25 and 0.35. The guide layer 32 is typically between about 0.3 and 0.6 μm thick and is composed of N-type $Al_xGa_{1-x}As$ where x is between about 0.15 and 0.30. The active layer 34 is typically between about 0.05 and 0.12 μm thick and is typically composed of $Al_yGa_{1-y}As$ where y is between about 0.0 and 0.15 and preferably between about 0.03 and 0.12. The second cladding layer 36 is typically between about 0.8 and 1.5 μm thick and is typically composed of p-type $Al_zGa_{1-z}As$ where z is between about 0.25 and 0.45 and preferably between about 0.3 and 0.35. The capping layer 38 is typically between about 0.5 and 1.0 μm thick and is typically composed of P-type GaAs and is used to facilitate the ohmic electrical contact with the underlying semiconducting layer.

The electrically insulating layer 40 is typically composed of silicon dioxide which is deposited by pyrolytic decomposition of a silicon-containing gas, such as silane, in oxygen or water vapor. An opening 42 is formed through the electrically insulating layer 40 using standard photolithographic masking and etching processes. The electrical contact 44 is then deposited over the capping layer 38 where it is exposed in the opening 42. This contact is preferably composed of sequentially evaporated titanium, platinum and gold. The second electrical contact 46 to the substrate 18 is formed by sequential evaporation of germanium, gold, nickel and gold layers, followed by a sintering step.

The reflecting surfaces 14(a) through which light is emitted is typically coated with a layer of $Al_2O_3$ or a similar material having an optical thickness of about one-half wave at the lasing wavelength as disclosed by Ladany et al. in U.S. Pat. No. 4,178,564 or with a coating having an optical thickness of about one-quarter wave. The opposed end face 14(b) is coated with a reflective coating consisting of an electrical insulator such as $SiO_2$ coated with a layer of gold as disclosed by Caplan et al. in U.S. Pat. No. 3,701,047. Alterntively the mirror may be a multi-layer reflector such as that disclosed by Ettenberg in U.S. Pat. No. 4,092,659. All three of these patents are incorporated herein by reference.

EXAMPLE

Devices having the structure shown in FIG. 1 were fabricated by liquid-phase epitaxy according to the principles of the invention on the (100) surface of a N-type GaAs substrate wafer. Thirteen channels 3 μm wide at the surface and 1.5 μm deep were formed in the substrate surface with non-uniform center-to-center spacings symmetrical about the center channel. The spacings were 7 μm, 6 μm, 5.5 μm, 5 μm, 4.5 μm and 4 μm with the smaller spacing at the edge of the array. The first cladding layer was 0.4 μm thick over the lands in the center of the array and was composed of $Al_{0.4}Ga_{0.6}As$. The cavity region, comprising only an active layer, was 0.08 μm thick over the center of the array and was composed of $Al_{0.06}Ga_{0.94}As$. The second cladding layer was 1.5 μm thick and was composed of $Al_{0.4}Ga_{0.6}As$. The GaAs capping layer was 0.5 μm thick. An $SiO_2$ electrically insulating layer about 0.1 μm thick was deposited on the capping layer and a 30 μm wide opening was formed in this layer over the seven central channels in the substrate. The remaining channels were not used because of non-uniformities in the deposited layers at the extremities of the array. A broad-area metal contact consisting of sequentially evaporated titanium, platinum and gold contacted the capping layer in the $SiO_2$ layer over the seven central channels. The second contact to the substrate consisted of sequentially evaporated layers of germanium, gold, nickel and gold which were then sintered. Bars about 300 μm wide were then cleaved from the wafer. One cleaved end face of the bars was coated with a $Al_2O_3$ half-wave coating and the opposed end face was coated with a six-layer dielectric stack reflector.

Figure 3:
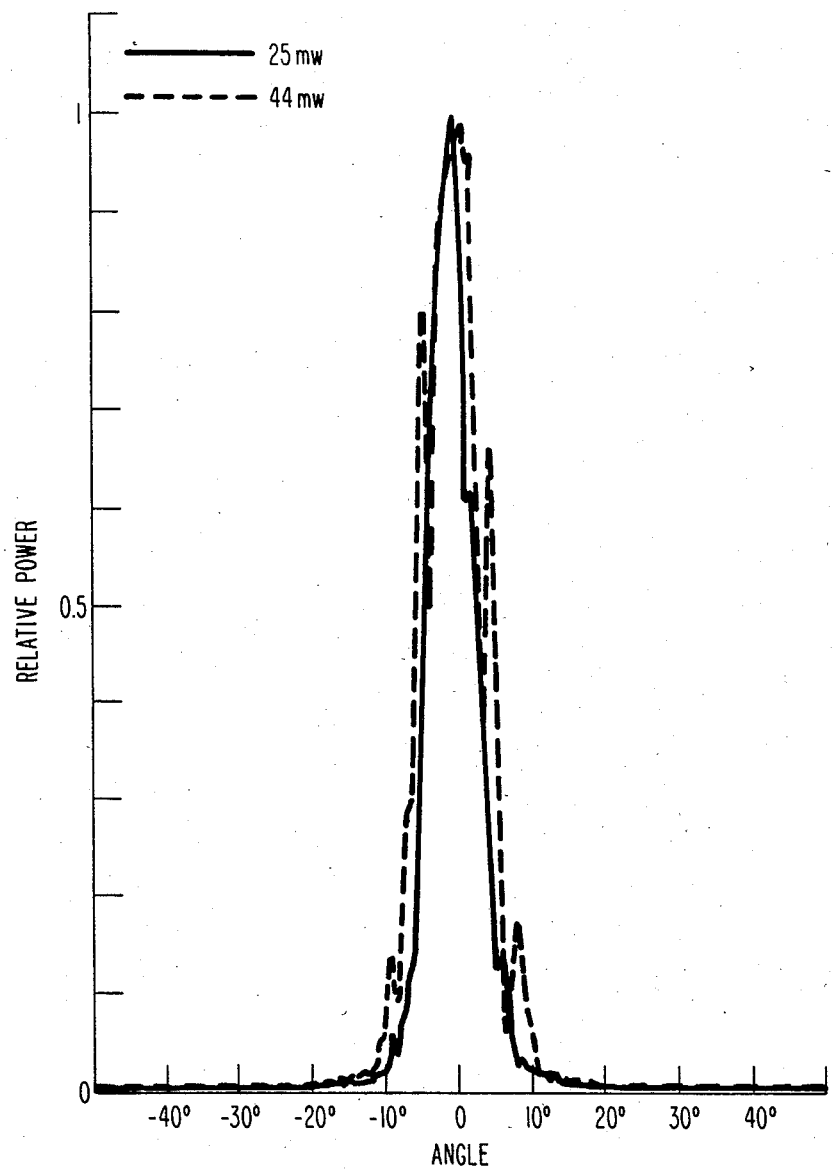
FIG. 3 is a graphical illustration of the lateral far-field radiation pattern of a laser array at two different power levels.

Arrays were then diced from these bars and mounted P-side down on copper mounts for testing. Testing consisted of measurements of the I-V curve, the near- and far-field radiation patterns and the output wavelength spectrum. Threshold current densities of about 2,000 amps/cm² were observed for the devices tested. The near-field radiation pattern, as observed through a television-equipped microscope, showed seven separate lasing regions at the emitting end face. About 15% of the devices tested exhibited a cw single-lobe, far-field radiation pattern in the lateral direction with the central lobe having a full width at half maximum of about 3 to 5 (λ/D), where D is the full aperture of the array, up to a total output power of 25 milliwatts. At the cw output power of about 40 milliwatts additional lobes are observed. The far-field patterns at 25 and 40 milliwatts for a laser array typical of this group are shown in FIG. 3. For operation of the arrays with 50 nanosecond pulses at a 50% duty cycle, a single-lobed pattern was observed up to about 40 milliwatts and then the pattern degenerated. In almost all cases, the wavelength spectrum exhibited a single, strong emission line between about 8465Å and 8485Å and shifted to longer wavelengths with increased drive level.

These results demonstrate a marked increase in the yield of arrays from the wafer having a single-lobed, far-field radiation pattern over that observed previously. Previously the great majority of arrays exhibited a two-lobed radiation pattern consistent with the understanding that the 180° phase difference between adjacent coupled regions was preferred. The appearance of one or a few single-lobed devices was due, then, to some unknown perturbation of the array structure. Here, the intentional addition of a particular perturbation, namely non-uniform spacing of the lasing regions, has significantly increased the number of devices exhibiting single-lobed operation. Comparison of the cw and past output data show that the shift from single- to two-lobed behavior may be at least partially thermally induced.

I claim:

1. In a phase-locked laser array including a body of semiconductor material having therein a cavity region and means for defining a plurality of substantially parallel lasing regions in the cavity region which have uniform widths in the lateral direction and which are spaced an effective distance apart so that the modes of oscillation in the different lasing regions are phase-locked to one another;

the improvement wherein the center-to-center spacing between the lasing regions in the lateral direction varies monotonically.

2. The array of claim 1 wherein said means for defining the plurality of lasing regions comprise a plurality of channels extending a distance into a substrate wherein the lasing regions in the cavity region are centered over the channels.

3. The array of claim 2 wherein the center-to-center spacing decreases with increasing distance in the lateral direction from the center of the array.

4. The array of claim 2 wherein the center-to-center spacing of the channels increases with increasing distance in the lateral direction from the center of the array.

5. The array of claim 1 wherein the means for defining the plurality of lasing regions comprise a plurality of openings of uniform width in an electrically insulating layer over the cavity region wherein the lasing regions are centered under the openings in the electrically insulating layer.

6. The array of claim 5 wherein the center-to-center spacing between the openings decreases with increasing distance in the lateral direction from the center of the array.

7. The array of claim 5 wherein the center-to-center spacing between the openings increases with increasing distance in the lateral direction from the center of the array.

8. The array of claim 1 wherein the center-to-center spacing of the lasing regions decreases with increasing distance in the lateral direction from the center of the array.

9. The array of claim 1 wherein the center-to-center spacing of the lasing regions increases with increasing distance in the lateral direction from the center of the array.

10. The array of claim 1 wherein the means for defining the lasing regions comprise structural variations in the array which produce a plurality of optical index waveguides.

11. The array of claim 1 wherein the means for defining the lasing regions comprise structural variations in the array which produce a plurality of gain-induced optical waveguides.

* * * * *